United States Patent [19]
Ando et al.

[11] Patent Number: 4,862,487
[45] Date of Patent: Aug. 29, 1989

[54] SOLID-STATE IMAGING DEVICE

[75] Inventors: Haruhisa Ando, Tokyo; Masaaki Nakai, Tokorozawa; Hideyuki Ono, Kokubunji; Toshifumi Ozaki, Koganei; Shinya Ohba, Kanagawa; Norio Koike, Tokyo, all of Japan

[73] Assignee: Hitachi, Ltd., Tokyo, Japan

[21] Appl. No.: 178,197

[22] Filed: Apr. 6, 1988

[30] Foreign Application Priority Data

Apr. 8, 1987 [JP] Japan .................................. 62-84736

[51] Int. Cl.$^4$ ...................... G11C 19/28; H01L 29/78; H03K 3/42; H04N 3/14
[52] U.S. Cl. ........................................ 377/58; 357/24; 307/311; 358/213.19
[58] Field of Search ............ 357/24 LR, 30; 377/57-63; 307/311; 358/213.19, 213.26, 213.25

[56] References Cited

U.S. PATENT DOCUMENTS 4,322,753 3/1982 Ishihara ..................... 357/24 LR
4,651,215 3/1987 Bell et al. .................. 358/213.25
4,743,778 5/1988 Takatsu et al. ............ 358/213.19
4,783,702 11/1988 Sone et al. ................ 358/213.19
4,800,435 1/1989 Ikeda et al. ............... 358/213.19

OTHER PUBLICATIONS

Ishihara et al "Interline Image Sensor with an Anti Blooming Structure" 1982 IEEE Int. Solid-State Circuits Conf. (2/82), Dig. Tech. Papers pp. 168–169.
Kuroda et al "A Smear-Suppressing CCD Imager" 1986 IEEE Int. Solid-State Circuits Conf. (2/86), Dig. Tech. Papers pp. 94–95.

Primary Examiner—Gene M. Munson
Attorney, Agent, or Firm—Antonelli, Terry & Wands

[57] ABSTRACT

Vertical CCD registers constituting parts of an interline type CCD imaging device hold independently the signal charges transferred from photoelectric conversion elements and having different storage durations. Transfer of charge to the vertical CCD registers from the photoelectric conversion element is performed at least twice during one field period. The vertical CCD registers transfer the signal charges of different storage durations independent of one another.

9 Claims, 10 Drawing Sheets

SOLID-STATE IMAGING DEVICE

BACKGROUND OF THE INVENTION

1. Field of the Invention

The present invention relates generally to an imaging device and more particularly to a solid-state imaging device comprising a plurality of photoelectric conversion elements integrated on a semiconductor substrate.

2. Description of the Related Art

The solid-state imaging device has numerous advantageous features such as reduced size, light weight, freedom from maintenance, elongated uselife and others which are excellent over those of the image pick-up tube. Being backed up by the remarkable progress in the semiconductor technology, the solid-state imaging device is now developed to such a state as to replace the image pick-up device from the stand point of the manufacturing costs as well as performance.

The solid-state imaging device can be generally classified into two categories, i.e. the MOS type solid-state imaging device in which signal charges generated by photoelectric conversion elements (such as photodiodes or the like) are read out over aluminum signal lines through MOS transistors and the CCD type solid-state imaging device in which photoelectric charges generated by the individual photoelectric conversion elements are read out through CCD (abbreviation of Charge Coupled Device) shift registers. The CCD type solid-state imaging device in turn can be classified into three types, that is, a frame transfer type CCD imaging device which includes light-receiving or light-sensitive parts and charge storage parts separately from each other, an interline type CCD solid-state imaging device having stripe-like charge storage parts and charge transfer parts between light-sensitive pixels (or picture elements), and a FIT (Frame Interline Transfer) type CCD imaging device which is a hybrid of the frame transfer type and interline type device. These types of CCD solid-state imaging devices enjoy an advantageous feature in that the photoelectric signal charges generated by the photoelectric elements can be outputted with high efficiency, whereby noise generation can be reduced significantly as compared with the MOS type imaging device.

A typical one of the CCD solid-state image device is disclosed in ISSCC 82, pp. 168-169 and ISSCC 86, pp. 94-95.

For having a better understanding of the present invention, an interline type CCD solid-state imaging device known heretofore will be described in some detail by referring to FIGS. 1 and 2 of the accompanying drawings, in which FIG. 1 shows a structure of the hitherto known interline type CCD solid-state imaging device.

Referring to FIG. 1, each of photoelectric conversion elements 1 is constituted by a photodiode implemented in the form of a pn-junction diode. The element 1 converts photoelectrically the light incident thereon into photoelectric signal charge and stores the charge therein. These photoelectric conversion elements are disposed in vertical and horizontal arrays in a regular matrix-like configuration. Vertical CCD registers 3 are provided for the vertical rows of the photoelectric conversion elements in one-to-one correspondence for shifting or transferring electric charges in the vertical direction. A select gate 2 is provided between each of the photoelectric conversion elements and the associated one of the vertical CCD registers 3 for the purpose of controlling the signal charge flow from the photoelectric conversion element to the associated vertical CCD register 3. A horizontal CCD register 4 are provided at one ends of the vertical CCD registers 3 for receiving in parallel the signal charges transferred through the individual vertical CCD registers 3 to thereby transfer the received charges in the horizontal direction. An output amplifier 5 is provided at one end of the horizontal CCD register 4 for amplifying the signal charges transferred the horizontal CCD register 4.

The photoelectric signal charge stored in the photoelectric conversion element 1 is transferred to the associated vertical CCD register through the select gate 2. The signal charge thus selected is then transferred to the output amplifier 5 through the vertical CCD register 3 and horizontal CCD register 4 to be finally outputted from through the output amplifier 5 as the image (video) signal.

The vertical CCD register 3 is usually driven by a four-phase clock signal. Accordingly, four phase clock wires 6 to 9, 10 to 13, 14 to 17 are connected to the vertical CCD registers 3, wherein the clock wires for two phases 7; 9; 11; 13 and 15; 17 serve also as gate wires for the select gates 2.

Operation of the vertical CCD registers 3 of the imaging device will be explained by referring to FIGS. 2A and 2B of the accompanying drawings, wherein FIG. 2A is a sectional view of the vertical CCD register 3 taken along a line A—A' in FIG. 1 and FIG. 2B shows time charts for illustrating charges in potential in the vertical CCD register 3 as a function of time. Upon application of the clock pulses $\phi_{V2}$ and $\phi_{V4}$ onto the clock wires (gate wires) 11, 13, 15 and 17, photoelectric signal charges $Q_3$, $Q_4$, $Q_5$ and $Q_6$ stored in the photodiodes 1 are transferred to areas underlying the gate electrodes of the associated vertical registers 3, respectively. At a time point $t_2$, the clock pulse $\phi_{V3}$ is applied onto the clock wires 12 and 16, resulting in that the photoelectric signal charges $Q_3$ and $Q_4$ on one hand and the photoelectric signal charges $Q_5$ and $Q_6$ on the other hand are mixed together into photoelectric signal charges $(Q_3+Q_4)$ and $(Q_5+Q_6)$, respectively. Subsequent successive applications of the clock pulses at time points $t_3$, $t_4$ and $t_5$ in the similar manner result in that the photoelectric signal charges $(Q_1+Q_2)$, $(Q_3+Q_4)$ and $(Q_5+Q_6)$ resulting from the mixing are sequentially transferred in the vertical direction. The photoelectric signal charges transferred in this manner are outputted to the output amplifier 5 sequentially through the horizontal CCD register 4 during the vertical scan period. Upon completion of the transfer of all the signal charges present in the vertical CCD register 3, then the photoelectric signal charges stored in the individual photodiodes 1 are again transferred to the vertical CCD registers 3, whereby the similar process described above is repeated. As will now be seen, the signal storage period in the hitherto known imaging device corresponds to the time required for the signal charges to be transferred through the vertical CCD register 3, i.e. the time equal to one field period.

In the solid-state imaging device known heretofore, the number of the signal charges which can be transferred through the vertical CCD register is limited by the number of transfer electrodes of the vertical CCD register and phase number of the clock pulse signal.

Consequently, the signal storage time of the photodiode remains constant, whereby a problem arises that the signal charge storage time or duration can not be controlled freely, making it impossible to implement the electronic shutter function and others.

SUMMARY OF THE INVENTION

An object of the present invention is to provide a solid-state imaging device having an electronic shutter function through which the signal charge storage time can be varied in a facilitated manner.

In view of the above object, it is proposed according to an aspect of the present invention that the signal charge transfer from the photoelectric conversion elements to the vertical charge transfer means is performed at least twice during one field period, wherein the vertical charge transfer means are so arranged as to transfer the charges transferred thereto independent of one another.

In a preferred embodiment of the present invention, the vertical charge transfer means transfer the signal charges having respective different storage durations independent of one another during one field period, the signal charges being read out through the horizontal charge transfer means. In this manner, the signal charges having respective different storage durations an be outputted without being mixed together, thus making it possible to select arbitrarily the charge storage time or duration. In other words, the electronic shutter function can be implemented in the solid-state imaging device.

These and other objects and many of the attendant advantages of the present invention will be readily appreciated as the same becomes better understood by reference to the following detailed description when considered in connection with the accompanying drawings.

DESCRIPTION OF THE PREFERRED EMBODIMENTS

The present invention will now be described in detail in conjunction with a first exemplary embodiment thereof by reference to FIG. 3.

Figure 1:
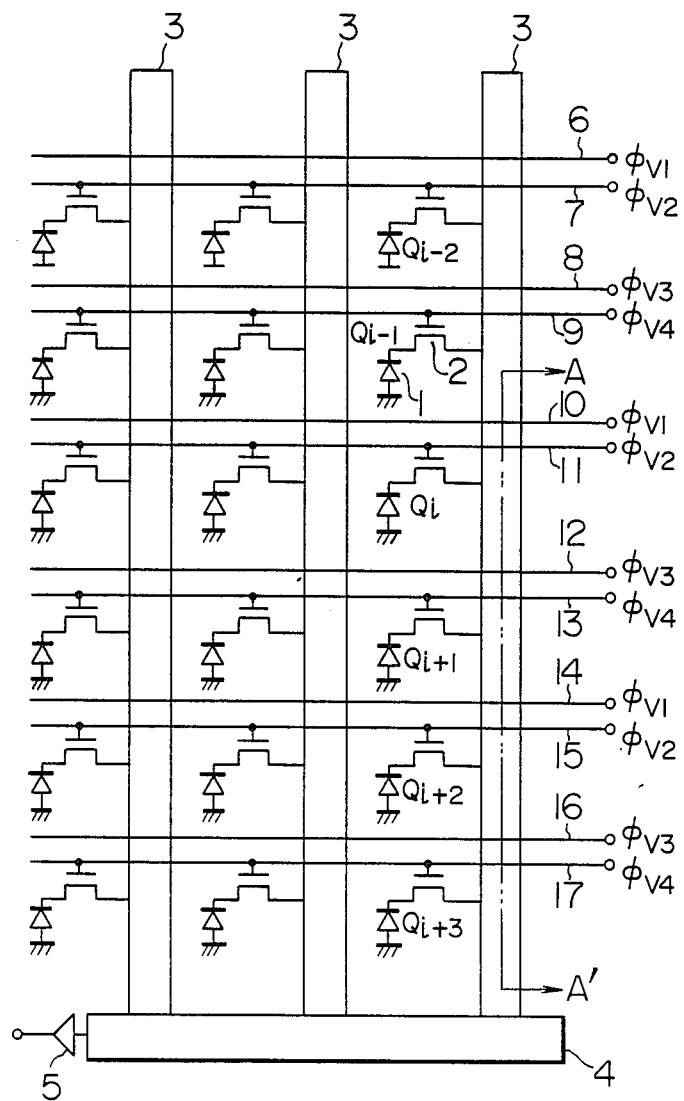
FIG. 1 is a schematic circuit diagram showing a structure of a solid-state imaging device known heretofore.
Figure 2A:
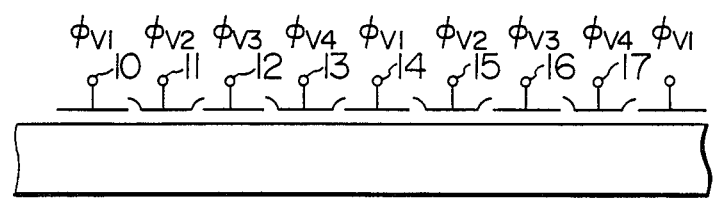
FIG. 2A is a schematic sectional view of a vertical CCD register taken along the line A—A' in FIG. 1.
Figure 2B:
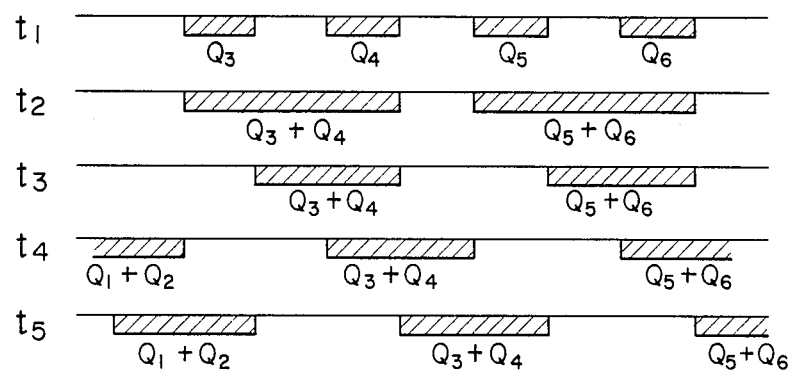
FIG. 2B is a time chart for illustrating changes in potential as a function of time in the vertical CCD register shown in FIG. 2A.
Figure 3:
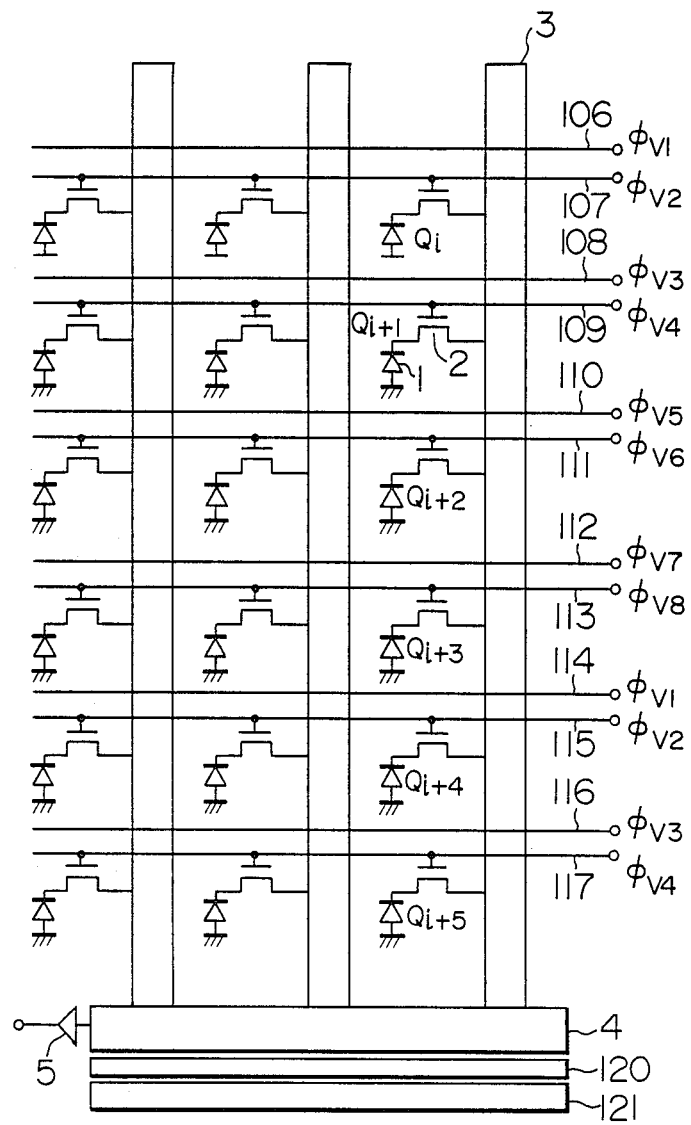
FIG. 3 is a schematic circuit diagram showing a general arrangement of a solid-state imaging device according to an exemplary embodiment of the present invention.

FIG. 3 shows a general arrangement of the solid-state imaging device according to an embodiment of the present invention which is, by and large, identical with that of the hitherto known device shown in FIG. 1 except for the differences in that the clock wires 106 to 117 of the vertical CCD registers 3 are driven by clock signals of eight phases, and that a charge sink region 121 is additionally provided for sweeping off useless charges in combination with an interposed coupling region 120 for connecting the charge sink area 121 to the horizontal CCD 4. Useless charges of those transferred from the vertical CCD registers 3 during each horizontal blanking period are transferred to the charge sink region 121 through the coupling region 120. The charge sink region 121 may be formed of an impurity-diffused layer to which a voltage is applied externally.

Now, description will be directed to the operation of the solid-state imaging device shown in FIG. 3 by reference to FIGS. 4A and 4B, FIGS. 5A and 5B and FIG. 6.

Figure 4A:
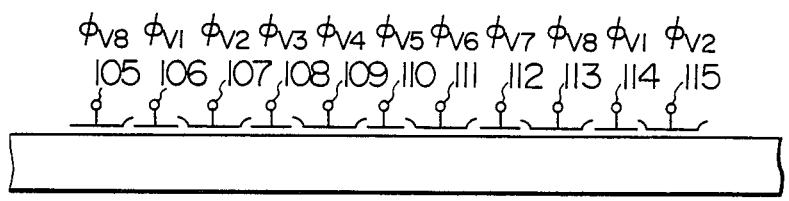
FIG. 4A is a schematic sectional view of a vertical CCD register shown in FIG. 3.
Figure 4B:
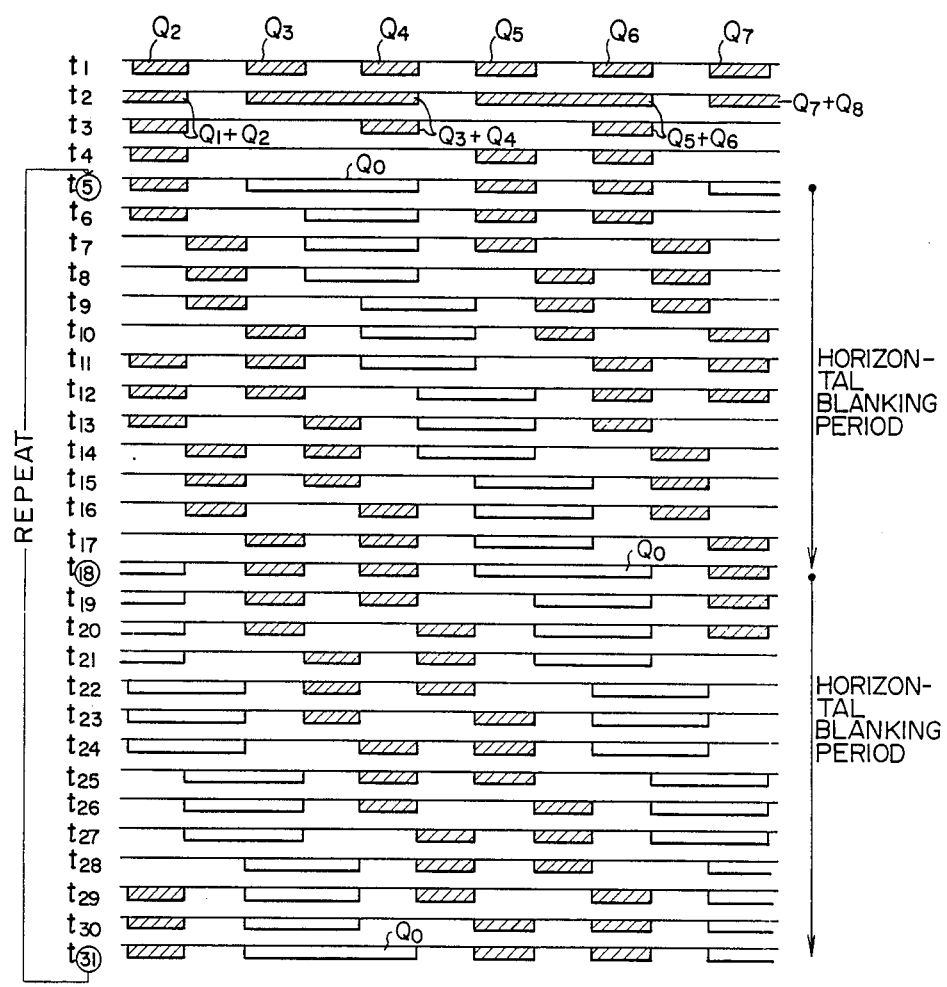
FIG. 4B is a time chart for illustrating changes in potential in the vertical CCD register shown in FIG. 4A as a function of time.
Figure 5A:
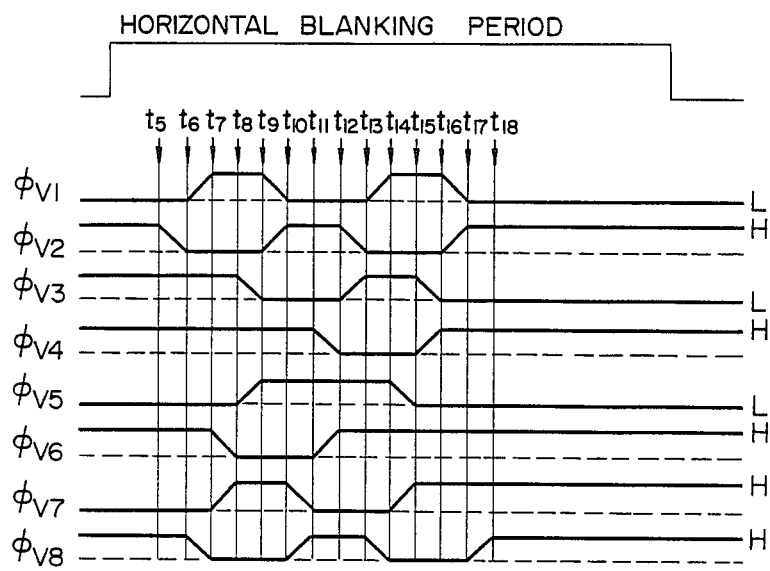
FIGS. 5A and 5B are signal waveform diagrams illustrating pulse signals employed for driving the vertical CCD registers shown in FIG. 3.
Figure 5B:
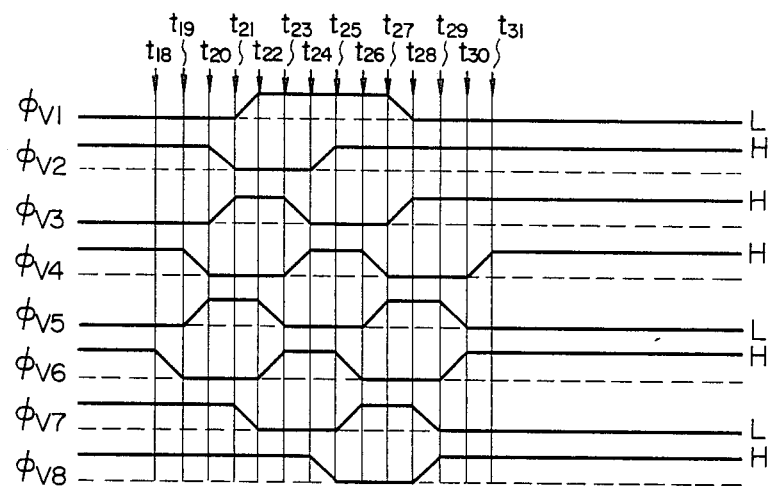
Figure 6:
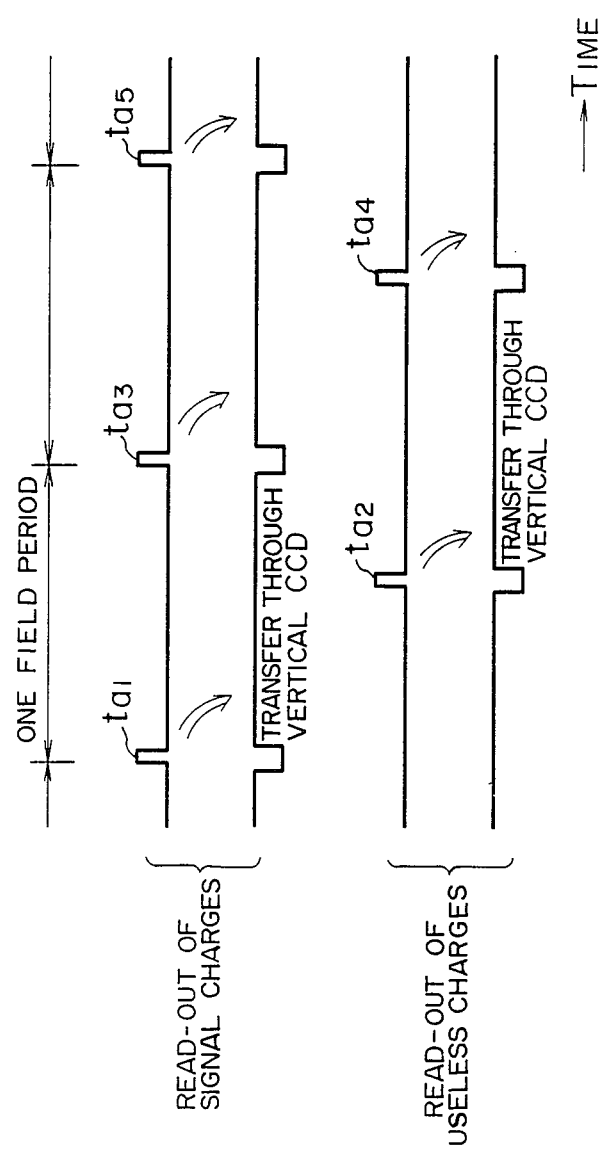
FIG. 6 is a timing chart for illustrating driving operation in the solid-state imaging device shown in FIG. 3.

FIG. 4A is a sectional view showing schematically a structure of the vertical CCD register 3, and FIG. 4B is a view for illustrating change in potential in the vertical CCD register 3 shown in FIG. 4A. Further, FIGS. 5A and 5B are views showing driving pulse signals for the vertical CCD registers 3. Finally, FIG. 6 is a timing chart for illustrating the driving operation of the solid-state imaging device shown in FIG. 3.

At a time point $t=t_1$ shown in FIG. 4B (corresponding to $t=t_{a1}$ in FIG. 6), a high voltage clock signal is applied to clock wires 105, 107, 109, 111, 113 and 115, which serve also as the gate wires for transferring the photoelectric signal charges stored in the individual photodiodes 1 to the vertical CCD registers 3. As the result, the signal charges $Q_2$, $Q_3$, $Q_4$, $Q_5$, $Q_6$, and $Q_7$ are stored underneath the associated electrodes of each vertical CCD register. The signal charges transferred to the vertical CCD register 3 are held in the regions indicated by hatching.

As a time point $t=t_2$, the clock pulses $\phi_{V3}$ and $\phi_{V7}$ are applied to the clock wires 108 and 112, whereby the signal charges $Q_3$ and $Q_4$ on one hand and the signal charges $Q_5$ and $Q_6$ on the other hand are, respectively, mixed together to the signal charges $(Q_3+Q_4)$ and $(Q_5+Q_6)$.

At a time point $t=t_3$, the mixed signal charges $(Q_3+Q_4)$ and $(Q_5+Q_6)$ are stored underneath the electrodes associated with the clock wires 109 and 113, respectively.

At a time point $t=t_4$, only the signal charge $(Q_3+Q_4)$ is transferred to a region underlying the electrode of the succeeding stage.

During periods $t_5$ to $t_{18}$ and $t_{18}$ to $t_{31}$ which correspond to one horizontal blanking period, respectively, each of the signal charges is transferred to the vertical CCD register 3. The regions indicated by hatching represents those regions which hold the signal charges, while blank (non-hatched) areas $Q_0$ represent the empty regions for holding other signal charges.

Subsequently, the process corresponding to that carried out during the period ($t=t_5$ to $t_{31}$) is repeated for one field period to transfer the signal charges. In this process, if the signal charges stored in the photodiodes 1 are read out at a time point $t=t_{a2}$ shown in FIG. 6, the storage time of the signal charges capable of contributing to the generation of video (image) signal corresponds to the period of ($t_{a3}-t_{a2}$). The time points $t_{a1}, t_{a3}$ and $t_{a5}$ correspond to repetitions of one field period, and can be specified. Accordingly, by setting $t_2$ and $t_{a4}$ at arbitrary time points, the storage time or duration can be varied freely.

Next, description will be made in what manner the vertical CCD register 3 reads out the signal charges and the useless charges.

During the period of $t_{a1}$ to $t_{a3}$ shown in FIG. 6, the process carried out during the period of $t_5$ to $t_{31}$ shown in FIG. 4B is repeated. In that case, at the time point $t_{18}$ corresponding to $t_{a2}$ shown in FIG. 6, the empty or quiescent regions (no-signal region) $Q_0$ exist underneath the gates 111 ($\phi_{V6}$) and 113 ($\phi_{V8}$), respectively. Accordingly, at the time point $t_{18}$, the high voltage clock is applied to the clock wires 111 and 113 to read out the electric charge from the photodiodes 1. Further, at a succeeding time point $t_{31}$ corresponding to $t_{a2}$ shown in FIG. 6, the high voltage clock is applied to the clock wires 107 and 109 to read out the charges from the photodiodes 1. The signal charges thus read out through two operations performed at the time points $t_{18}$ and $t_{31}$ as mentioned above are transferred to the charge sink region 121 from the horizontal CCD register 4 by way of the coupling part 120 to be processed as the useless charges. In this manner, it is possible to read out the signal charges stored at other time points even during the normal signal transfer. Although it is assumed in the case of the example illustrated in FIG. 4 that the horizontal scan is performed at the time points $t_5$, $t_{13}$ and $t_{31}$, it will be appreciated that the horizontal scan is not necessarily limited to such timing. Further, the reading of the signal charges from all the regions indicated by the hatched areas is performed at the time point $t_1$. It should however be mentioned that this reading operation may be performed with a deviation in time of 1 H (horizontal blanking period) in correspondence with the timing at which the signal charges are read out from the blank regions (non-hatched regions). By way of example, the signal charges may be read out from the photodiodes corresponding to $\phi_{V6}$ and $\phi_{V8}$, being followed after lapse of 1 H by the reading of the signal charges from the photodiodes corresponding to the clocks $\phi_{V2}$ and $\phi_4$, for the purpose of uniformizing the storage duration of the individual signal charges in the regions indicated by the hatched areas. FIG. 5 shows an example of pulse timing for realizing the potential transitions illustrated in FIG. 4B. The pulses $\phi_{V1}$ to $\phi_{V4}$ rising up at the time point $t_5$ may be same as the pulses $\phi_{V5}$ to $\phi_{V8}$ rising up at the time point $t_{18}$ after lapse of one horizontal blanking period. Similarly, the pulses $\phi_{V5}$ to $\phi_{V8}$ rising up at the time point $t_5$ may be same as the pulses $\phi_{V1}$ to $\phi_{V4}$ rising up at the time point $t_{18}$.

Figure 7A:
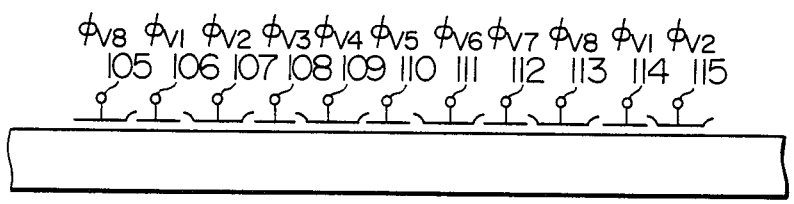
FIGS. 7A and 7B are views similar to FIG. 4A and show changes in potential as a function of time in a solid-state imaging device according to another embodiment of the present invention.
Figure 7B:
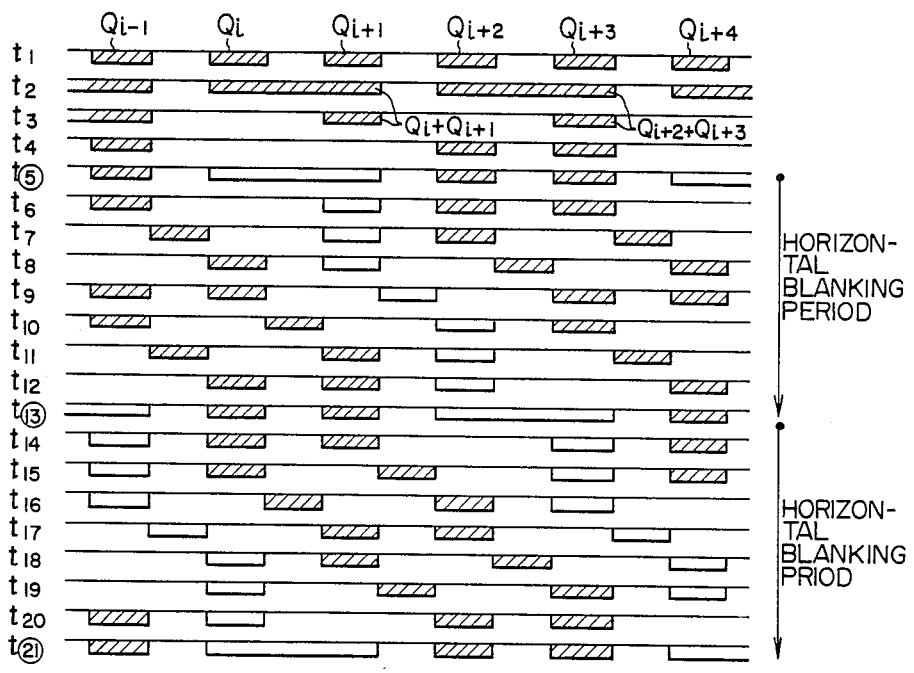

FIG. 7 shows a modification of the operation illustrated in FIG. 4 according to another embodiment of the invention. Since the number of the electrodes for the non-hatched regions is decreased, the amount of charges as transferred is decreased. However, the timing control is further simplified.

In the ordinary imaging operation requiring no electronic shutter operation, the clock signal of four phases can be used for driving the vertical CCD registers.

In the foregoing description of the embodiments of the invention, it has been assumed that the clock signal for driving the vertical CCD is of eight phases. It should however be mentioned that the aimed effects can be obtained by using the clock signal of at least seven phases.

Figure 8:
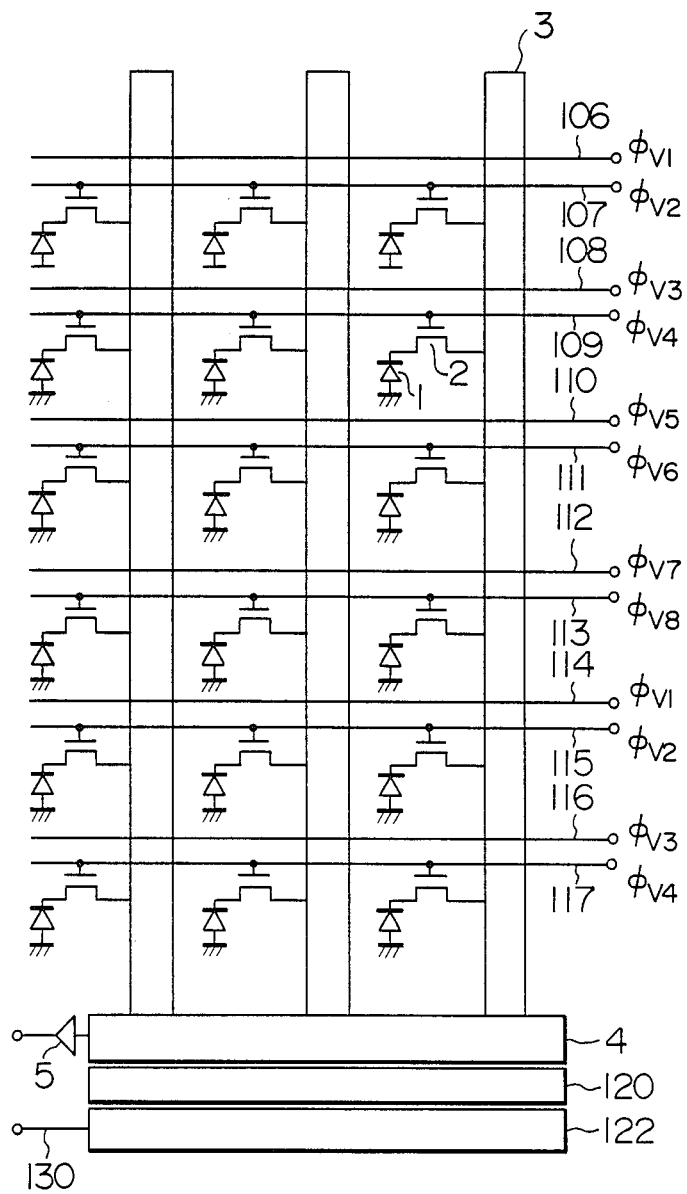
FIGS. 8 and 9 are schematic circuit diagrams showing, respectively, general arrangements of solid-state imaging devices according to other embodiments of the present invention.

FIG. 8 shows a solid-state imaging device according to another embodiment of the invention. The imaging device shown in FIG. 8 differs from the one shown in FIG. 3 in that the charge sink region 121 is replaced by a CCD register 122 destined for the charge absorption. The useless charges of those transferred through the vertical CCD registers 3 during each horizontal blanking period are transferred to the charge sink CCD register 122 by way of the interposed coupling part 120. The useless charges once fetched by the CCD register 122 are swept off from the external terminal by driving the CCD register 122.

Figure 9:
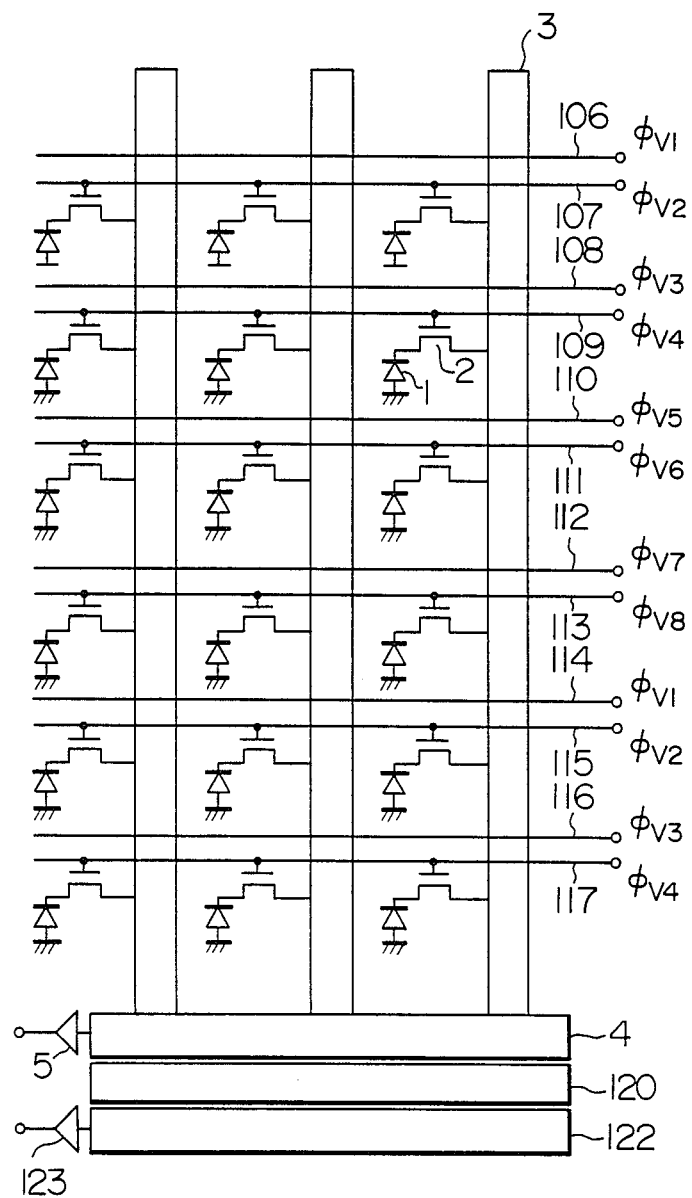

FIG. 9 shows a solid-state CCD imaging device according to still another embodiment of the invention which differs from that shown in FIG. 8 in that an output amplifier 123 is additionally provided for detecting and amplifying the charge signal outputted through the CCD register 122. With the arrangement shown in FIG. 9, it is possible to detect the charge signal originating in the non-hatched regions (quiescent regions) $Q_0$ shown in FIG. 4B, whereby the detection signal can be made use of in the image (video) signal processing.

Figure 10A:
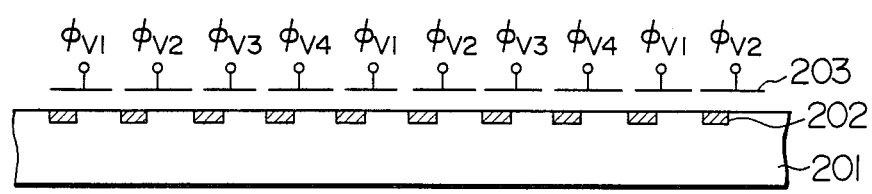
FIGS. 10A and 10B are views similar to FIG. 3 and show another exemplary structure of the vertical CCD register shown in FIG. 3.
Figure 10B:
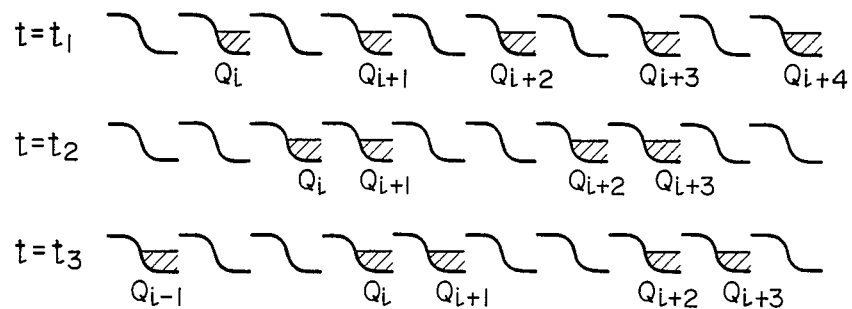

FIGS. 10A and 10B show another embodiment of the present invention, wherein FIG. 10A shows a vertical CCD register 3 in a fragmentary sectional view. As will be seen in FIG. 10A, impurity layers 202 are provided in the surface of a semiconductor substrate 201 for forming potential barriers for the charge carriers. With this arrangement, the potential distribution underneath the gate electrodes 203 can be made finer, as illustrated in FIG. 10B. Consequently, there are available an increased number of electrodes for reading the signal charges even with the clock signal of four phases. Thus, the signal storage duration can be controlled.

As will now be appreciated from the foregoing description, a solid-state imaging device having an electronic shutter function can be realized by virtue of the improved device structure in which the signal storage duration can be varied freely.

We claim:
1. A solid-state imaging device, comprising:
photoelectric conversion elements arrayed two-dimensionally on a major surface of a semiconductor substrate;
vertical charge transfer means for transferring signal charges from the photoelectric conversion elements disposed in vertical arrays;
select gate means for taking out the signal charge from said photoelectric conversion elements to said vertical charge transfer means; and
horizontal charge transfer means for transferring the signal charges from said vertical charge transfer means to an output end in a predetermined sequence;
wherein signal charge transfer from said photoelectric conversion elements to said vertical charge transfer means is carried out at least twice during one field period, said vertical charge transfer means transferring the received signal charges independent of one another.

2. A solid-state imaging device according to claim 1, wherein said vertical charge transfer means are driven by eight-phase driving pulse signal.

3. A solid-state imaging device according to claim 1, wherein said vertical charge transfer means are driven by four-phase driving pulse signal and includes impurity layers for forming potential barriers beneath associated electrodes.

4. A solid-state imaging device, comprising:
photoelectric conversion elements arrayed in a matrix-like configuration for storing signal charges corresponding to light information;
vertical charge transfer means for transferring signal charges from said photoelectric conversion means arrayed in vertical rows, said vertical charge transfer means transferring the signal charges of different storage durations independent of one another during one field period;
select gate means for taking out the signal charges from said photoelectric conversion elements to said vertical charge transfer means, the signal charge transfer from said photoelectric conversion element to said vertical charge transfer means being performed at least twice during one field period;
horizontal charge transfer means for transferring the signal charges from said vertical charge transfer means to an output end in a predetermined sequence; and
means for amplifying and outputting the signal charges from said horizontal charge transfer means.

5. A solid-state imaging device according to claim 1, further including means for eliminating useless charges having no contribution to generation of image signal from the signal charges transferred from said vertical charge transfer means.

6. A solid-state imaging device according to claim 1, wherein said horizontal charge transfer means transfers the signal charges of different storage durations to said output end independent of one another.

7. A solid-state imaging device according to claim 4, wherein said vertical charge transfer means are driven by eight-phase driving pulse signal.

8. A solid-state imaging device according to claim 4, wherein said vertical charge transfer means are driven by four-phase driving pulse signal and includes impurity layers for forming potential barriers beneath associated electrodes.

9. A solid-state imaging device, comprising:
photoelectric conversion elements arrayed twodimensionally on a major surface of a semiconductor substrate;
vertical charge transfer means for transferring signal charges from the photoelectric conversion elements disposed in vertical arrays;
select gate means for taking out the signal charge from said photoelectric conversion elements to said vertical charge transfer means; and
horizontal charge transfer means for transferring the signal charges from said vertical charge transfer means to an output end in a predetermined sequence;
wherein said vertical charge transfer means performs the following operations during one field period:
(a) read-out of first signal charges from all of said photoelectric conversion elements;
(b) forming in said vertical charge transfer means portions for holding said first signal charges read out and blank portions for holding other charges;
(c) sequential transferring of said first signal charges to said horizontal charge transfer means;
(d) read-out of second signal charges from said photoelectric conversion elements to said blank portions at a given time in the course of said transfer of said first signal charges; and
(e) transferring of said first and second signal charges independent of each other.

* * * * *